United States Patent [19]
Bechade et al.

[11] Patent Number: 5,430,387
[45] Date of Patent: Jul. 4, 1995

[54] TRANSITION-CONTROLLED OFF-CHIP DRIVER

[75] Inventors: Roland A. Bechade, South Burlington; Bruce A. Kauffman, Willinton; Charles R. London, Burlington, all of Vt.

[73] Assignee: International Business Machines Corporation, Armonk, N.Y.

[21] Appl. No.: 945,757

[22] Filed: Sep. 16, 1992

[51] Int. Cl.6 .......................................... H03K 17/16
[52] U.S. Cl. .......................................... 326/27; 326/34; 326/121
[58] Field of Search ............... 307/443, 451, 475, 263, 307/296.5

[56] References Cited

U.S. PATENT DOCUMENTS

| | | | |
|---|---|---|---|
| 4,276,487 | 6/1981 | Arzubi et al. | 307/270 |
| 4,329,600 | 5/1982 | Stewart | 307/540 |
| 4,477,741 | 10/1984 | Moser, Jr. | 307/473 |
| 4,540,904 | 9/1985 | Ennis et al. | 307/473 |
| 4,739,193 | 4/1988 | Doty, II | 307/443 |
| 4,797,579 | 1/1989 | Lewis | 307/443 |
| 4,857,770 | 8/1989 | Partovi | 307/451 |
| 4,882,507 | 11/1989 | Tatsumi et al. | 307/443 |
| 4,961,010 | 10/1990 | Davis | 307/451 |
| 4,975,599 | 12/1990 | Petrovick, Jr. | 307/451 |
| 5,008,568 | 4/1991 | Leung et al. | 307/451 |
| 5,015,880 | 5/1991 | Drake et al. | 307/443 |
| 5,017,807 | 5/1991 | Kriz | 307/443 |
| 5,089,724 | 2/1992 | Chuang et al. | 307/454 |
| 5,118,971 | 6/1992 | Schenck | 307/443 |
| 5,214,320 | 5/1993 | Truong | 307/451 |

FOREIGN PATENT DOCUMENTS

| | | |
|---|---|---|
| 0363505 | 4/1990 | European Pat. Off. . |
| 167811 | 6/1989 | Japan . |
| 3032113 | 12/1991 | Japan . |

OTHER PUBLICATIONS

Lee and Sonoda, Low-Power Dissipation FET Driver Circuit, Sep. 1971, IBM TDB vol. 14 No. 4, p. 1084.

Primary Examiner—Edward P. Westin
Assistant Examiner—Andrew Sanders
Attorney, Agent, or Firm—Heslin & Rothenberg

[57] ABSTRACT

A structure for and method of operating a transition-controlled off-chip driver is disclosed. Turn-on of output pulling devices is controlled, while turn-off is uncontrolled. An AC voltage reference circuit dissipating essentially zero DC power provides a reference voltage for control during transition. Turn-on control dissipates during transition, and ends when transition is complete without the use of output feedback.

16 Claims, 3 Drawing Sheets

| OCD INPUT SIGNAL 124 | ENABLE SIGNAL 126 | OCD OUTPUT 188 |
|---|---|---|
| X | 0 | HI-Z |
| 0 | 1 | 0 |
| 1 | 1 | 1 |

*fig. 3*

TRANSITION-CONTROLLED OFF-CHIP DRIVER

BACKGROUND OF THE INVENTION

1. Technical Field

The present invention relates generally to a structure for and method of operating an off-chip driver. More particularly, the present invention relates to an improved transition-controlled off-chip driver dissipating zero DC power.

2. Background Art

In recent years, there has been an increase in the need for off-chip drivers (OCD) that consume little power, offer predictable performance under varying process and operating conditions, and eliminate on-chip noise caused by the driver. This is particularly true with respect to microprocessors in the lap-top computer market where battery power conservation is required, while not sacrificing performance qualities.

A recent innovation in driver circuits, in particular those using CMOS technology, sought to provide predictable performance of such circuits in the face of widely varying process and operating conditions. This was accomplished by controlling transitions of output devices within driver circuits by compensating for best and worst case performance, i.e., fastest and slowest response times, respectively.

Such a transition control technique is described in U.S. Pat. No. 4,975,599. There, additional circuitry is used to oppose a fast turn-on of driver output devices and enhance a slow turn-on. Output feedback is used to disable compensation after transition is complete.

While the above scheme effectively controls such off-chip driver performance, it is not optimum where zero DC power dissipation and noise elimination are desired, as in the lap-top computer market. First, DC power dissipation from supply voltage to ground and in several transistor paths exists. Second, the use of feedback to end control after transition is complete introduces noise into the chip.

Other prior art transition control techniques exist, such as described in U.S. Pat. No. 5,017,807, that control transition and noise by using a resistor-capacitor network. However, such techniques dissipate DC power and control turn-off as well as turn-on of driver output devices. Control of turn-off may cause both output devices to be on simultaneously, which wastes unnecessary power.

While the prior art does provide effective transition-control techniques for more uniform performance of off-chip drivers, these techniques dissipate unnecessary DC power, control both turn-on and turn-off of driver output devices, potentially causing them to be on simultaneously, and introduce unnecessary noise by using feedback. Microprocessors in the lap-top market, may not operate optimally under such conditions. Thus, a need exists for off-chip drivers that dissipate zero DC power, control turn-on of output devices, but not turn-off, and eliminate output feedback noise.

DISCLOSURE OF INVENTION

Briefly, the present invention satisfies this need and overcomes the above-noted deficiencies through an improved off-chip driver and method of operating the same. A known technique for controlling turn-on of driver output devices is used. The basic driver circuit is modified to provide for uncontrolled turn-off of the driver output devices. Zero dissipation of DC power is achieved by the addition of an AC voltage reference circuit providing a reference voltage during turn-on of the output device in question for transition control. By the end of a transition, the AC reference voltage has dissipated, effectively ending control. Noise is substantially reduced by eliminating output feedback as a mechanism to end control after transition is complete.

These, and other objects, features and advantages of this invention will become apparent from the following detailed description of the presently preferred embodiment of the invention taken in conjunction with the accompanying drawings.

BRIEF DESCRIPTION OF DRAWINGS

FIG. 3 depicts a truth table for the off-chip driver circuit of FIG. 2.

BEST MODE FOR CARRYING OUT THE INVENTION

Figure 1:
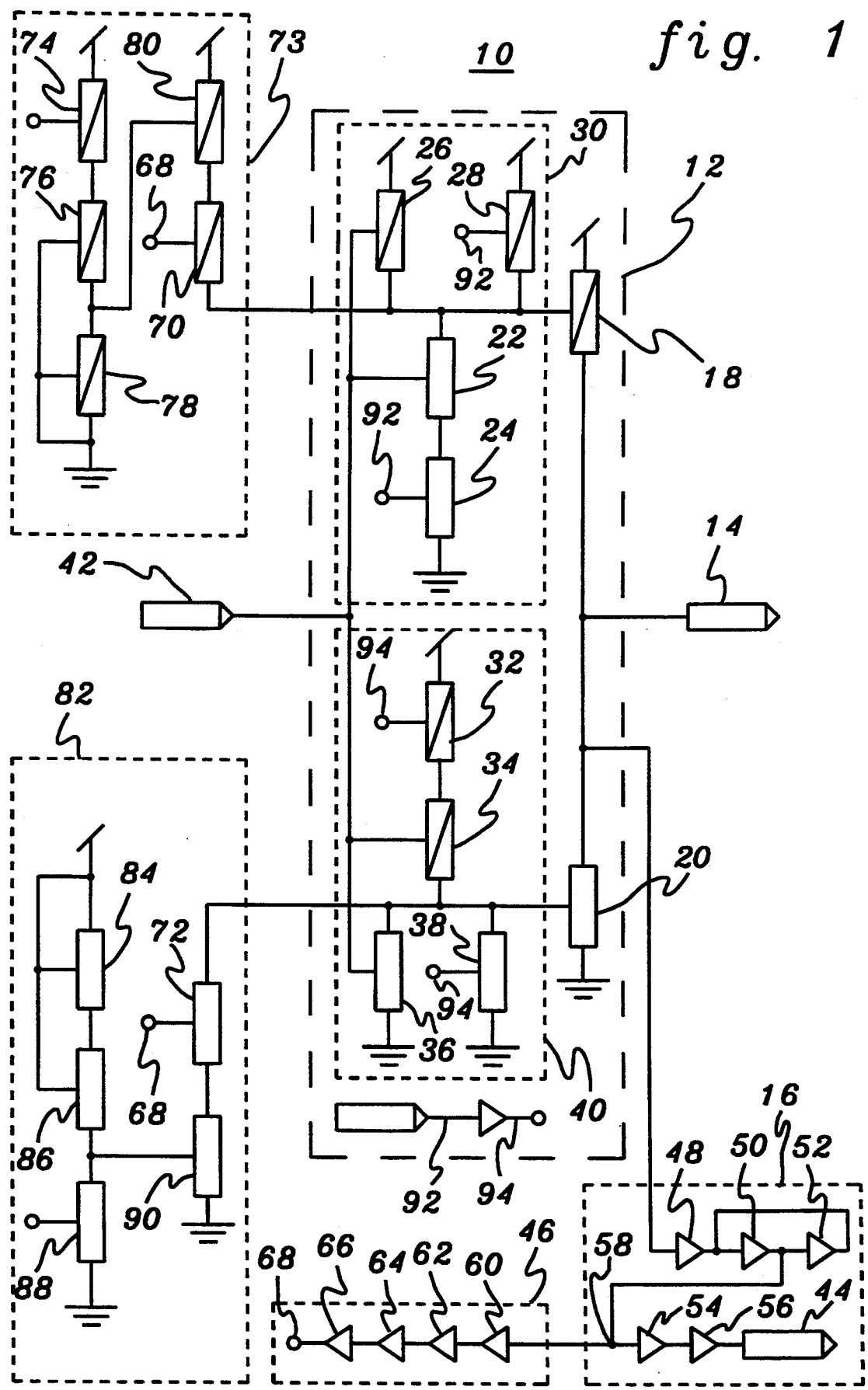
FIG. 1 depicts a prior art transition-controlled off-chip driver circuit.

FIG. 1 presents a CMOS transition-controlled off-chip driver 10 constructed according to U.S. Pat. No. 4,975,599, the disclosure of which is incorporated herein by reference.

Conventional driver circuit 12 drives off chip load 14. Driver circuit 12 is also connected to a receiver circuit 16. The driver circuit includes a pull-up P/FET transistor 18 and a pull-down N/FET transistor 20 coupled in a conventional way to drive load 14. Transistor 18 is turned on by transistors 22 and 24, connected as shown in FIG. 1, and turned off by transistors 26 and 28. Transistors 22, 24, 26 and 28 constitute a conventional nand gate 30. Similarly, transistor 20 is turned on by transistors 32 and 34, connected as shown, and turned off by transistors 36 and 38. Transistors 32, 34, 36 and 38 constitute a conventional NOR gate 40.

The signal to operate transistors 22 and 26 and transistors 34 and 36 is provided by input source 42. In a well-known manner, when a signal is provided to transistors 22 and 34, one or the other will turn on, which turns on the respective pulling transistor 18 or 20, supplying voltage to load 14 and receiver 16. Receiver 16 is the receiver portion of a bidirectional input/output circuit and drives on-chip load 44 as well as delay line 46. Transistors 18 and 20 will also provide a signal to receiver 16, comprised of inverters 48, 50 and 52 connected in series, and inverters 54 and 56 connected in series and tapped between inverters 50 and 52. Inverter 56 supplies a signal to load 44. Receiver 16 acts as a buffer sensing when driver 12 has switched on completely (i.e., transition is complete) provides an output signal at node 58. Delay line 46 comprises inverters 60, 62, 64 and 66 connected in series, and receives the output signal at node 58. Delay line 46 provides a feedback signal to node 68 which is connected to the gates of transistors 70 and 72.

Compensation circuit 73 includes P/FET transistors 74, 76 and 78 connected in series, as well as transistor 80. As shown in FIG. 1, the gate of transistor 80 is connected between transistors 76 and 78, which act as a voltage divider. Transistor 74 operates under testing conditions only for the purpose of shutting off DC current in transistors 76 and 78.

The output of transistors 70 and 80 is merged with the output of N/FET transistors 22 and 24 such that the outputs are in opposition to each other; that is, the output from transistors 22 and 24 tends to turn pull-up transistor 18 on, whereas the output of transistors 70 and 80 tends to turn transistor 18 off. Transistors 70 and 80 are designed so that they are less powerful than transistors 22 and 24, and therefore only act to slow down fast turn-on or speed up slow turn-on of transistor 18.

Compensation circuit 82 operates in a similar manner to compensation circuit 73. Compensation circuit 82 comprises N/FET transistors 84, 86 and 88 connected in series. The gate of transistor 90 is connected between transistors 84 and 86, which act as a voltage divider, as shown in FIG. 1. The output of transistors 72 and 90 is merged with that of turn-on transistors 32 and 34, and acts in opposition thereto, tending to turn off output pull-down device 20. Transistors 24 and 28 are connected to receive enable signal shown at 92, and transistors 32 and 38 are connected to receive nonenable signal shown at 94. Enable 92 and nonenable 94 allow the driver circuit 12 to be placed in a high impedance state as is well know in the art.

The speed at which transistors 18 and 20 turn on directly affects noise production in the driver circuit 12; the faster the turn-on, the more noise is produced. The speed of turn-on of transistors 18 and 20 is related to process and operating variables of driver circuit components. Thus, compensation for these performance-altering variables also controls the speed of turn-on and the noise created thereby. Variables tending to make transistors 22 and 24 faster also tend to make transistors 70 and 80 faster and vice-versa.

Therefore, since transistors 70 and 80 are designed to be less powerful, but more sensitive, than transistors 22 and 24, transition is effectively controlled. Transition control of pull-down transistor 20 is similar. Feedback at node 68 is used to turn off transition control when transition is complete.

While the driver circuit of FIG. 1 does control transition, DC power is dissipated and noise is introduced through feedback. DC power is dissipated via paths created by transistors 74, 76 and 78, and 84, 86 and 88. DC power can also be dissipated through paths created by transistors 80, 70, 22 and 24, and 32, 34, 72 and 90. A feedback path through delay line 46 allows transition control circuits 73 and 82 to turn-off after transition is complete. However, this feedback path introduces noise back into the driver circuit.

The present invention improves on the transition-controlled OCD of FIG. 1 by removing feedback delay line 46, which eliminates unnecessary noise fed back into the driver 12. The aforementioned DC power dissipation paths are eliminated by introducing an AC voltage reference circuit as will be described below. Although the basic compensation technique of U.S. Pat. No. 4,975,599 is retained, compensation circuits 73 and 82 are eliminated. Receiver circuit 16 may or may not be included in the improved circuit of the present invention. The following description of the present invention does not include a receiver circuit, but it will be understood that there could be one.

Figure 2:
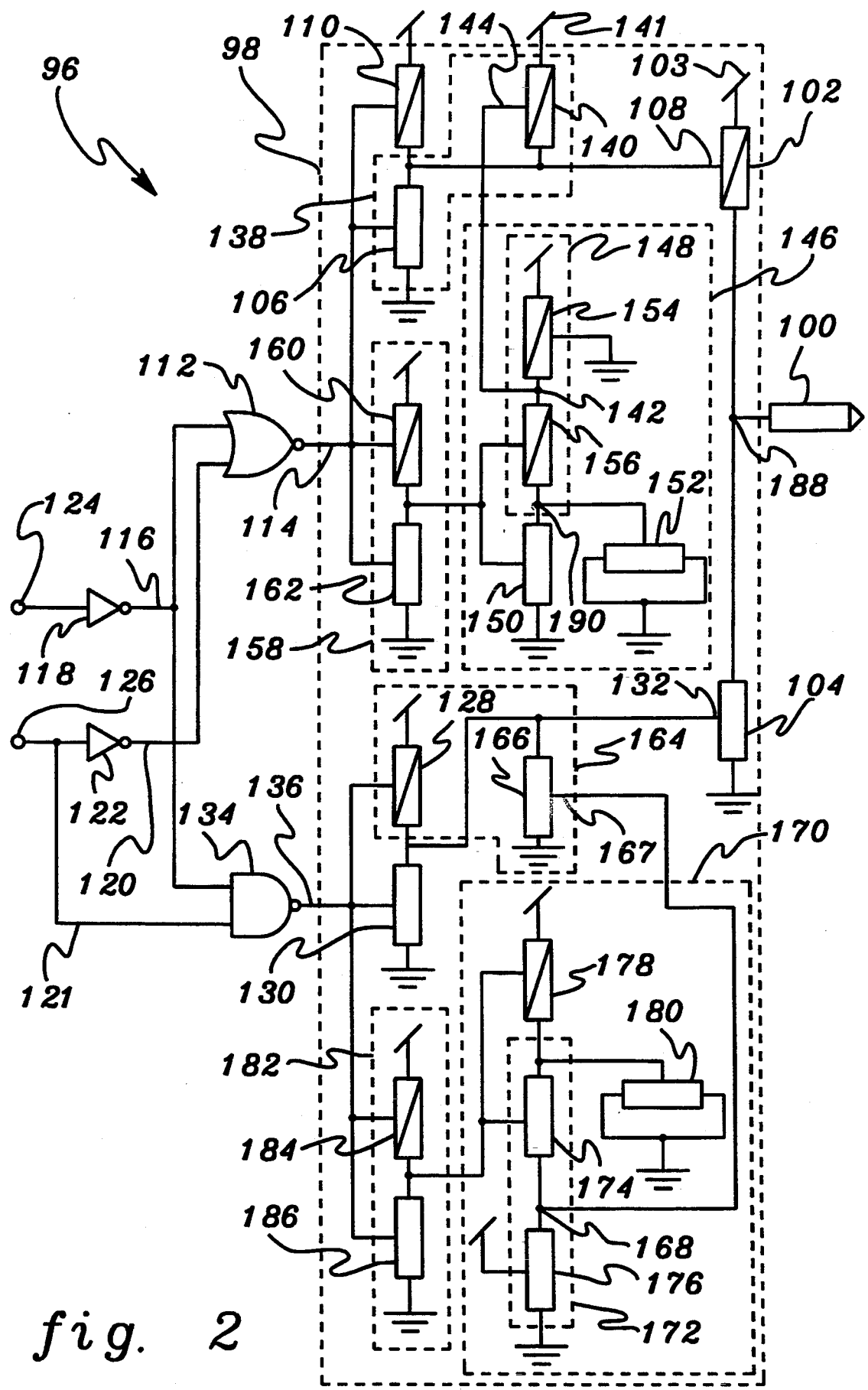
FIG. 2 depicts a transition-controlled off-chip driver circuit according to the present invention.

FIG. 2 shows a CMOS circuit 96 constructed according to the present invention. The circuit includes a driver circuit 98, which drives off-chip load 100. As in FIG. 1, the driver circuit includes a pull-up P/FET transistor 102, connected between power supply 103 and off-chip load 100, and a pull-down N/FET transistor 104, connected between off-chip load 100 and ground, coupled to drive the load 100. Transistor 102 is turned on via gate 108 by transistor 106. Transistor 110 is connected to pull-up transistor gate 108 as shown in FIG. 2 to turn transistor 102 off. A conventional nor gate 112 is connected between driver input 114, and inverted input signal line 116 (OCD input signal 124 passes through inverter 118) and inverted enable signal line 120 (OCD enable signal 126 passes through inverter 122).

Similarly, transistor 104 is turned on via gate 132 by transistor 128 and turned off by transistor 130. A conventional nand gate 134 is connected between driver input 136, and inverted input signal line 116 and enable signal line 121.

Voltage for turn-on is supplied to transistor 102 by a pull-up predrive circuit 138 consisting of N/FET transistor 106 and P/FET transistor 140. Transistors 106 and 140 act in opposition to control the turn-on of transistor 102 by controlling the voltage supplied to transistor 102 at gate 108. A reference voltage at node 142 is supplied to transistor 140 at gate 144 by an AC voltage reference circuit 146. The AC voltage reference circuit 146 comprises voltage divider network 148, transistor 150, and capacitor 152 interconnected as shown. Voltage divider network 148 comprises transistors 154 and 156. An AC voltage reference activator 158 functions to turn on AC voltage reference circuit 146 according to driver input 114, and comprises transistors 160 and 162 connected in series. Activator 158 is a conventional inverter.

Similarly, voltage for turn-on is supplied to transistor 104 by a pull-down predrive circuit 164 consisting of P/FET transistor 128 and N/FET transistor 166 connected in series. A reference voltage at node 168 is supplied to transistor 166 at gate 167 by an AC voltage reference circuit 170, comprising voltage divider network 172 consisting of transistors 174 and 176, transistor 178, and capacitor 180 interconnected as shown in FIG. 2. AC voltage reference activator 182 comprises transistors 184 and 186 connected in series. The function of AC voltage reference circuit 170 and activator 182 are similar to that of AC voltage reference circuit 146 and activator 158.

The operation of the OCD 96 shown in FIG. 2 will now be described. The discussion assumes that in a previous state, the OCD output at node 188 driving load 100 was low and is presently switching high. This means that transistor 104 is turning off and transistor 102 is turning on. In the previous state, when the output was low, transistor 102 was off, transistor 104 was on, and capacitor 152 was charged. In a similar manner, during the present transition to a high state, capacitor 180 will charge in preparation for a future transition to low so that it can supply a voltage to voltage divider network 172 which supplies a reference voltage at node 168 to transistor 166 for pull-down predrive circuit 164 to control turn-on of transistor 104 through the opposing actions of transistors 128 and 166. Once capacitor 152 was fully charged in the previous state, that part of driver 98 associated with pull-up transistor 102 consumed no power until the present transition to high.

As OCD input 124 switches high, there must also be a high signal at enable 126. These two signals are inverted at 116 and 120, respectively, through inverters 118 and 122. Two lows at nor gate 112 produce a high at driver input 114. Signals 116 and 121 produce a high at driver input 136 through nand gate 134. Pull-up transistor 102 comes on when a high exists at driver input 114. Pull-down transistor 104 comes on when a low exists at driver input 136. Thus, in the present discussion, transistor 102 is coming on while transistor 104 is turning off.

A high at driver input 114 causes transistor 106 to come on, providing a voltage at gate 108 of pull-up transistor 102. At the same time, the high signal at driver input 114 is inverted through AC voltage reference circuit activator 158. This causes transistor 150 to allow capacitor 152 to supply a voltage at node 190. Voltage divider 148 then supplies a reference voltage at node 142 which turns on transistor 140, and controls the turn-on of transistor 102.

Transistor 140, tending to turn off transistor 102, works in opposition to transistor 106, resulting in a controlled turn-on of transistor 102. Over time, the voltage supplied by capacitor 152 dissipates, resulting in eventual turn-off of transistor 140 and a withdrawal of control over the voltage supplied to pull-up transistor 102 at gate 108.

Now assume that input 124 is switching low, necessitating turn-off of pull-up transistor 102 and turn-on of pull-down transistor 104 to pull-down the voltage at node 188, previously supplied to load 100 by transistor 102. In order to avoid transistors 102 and 104 being on simultaneously during a transition, and hence dissipating unnecessary power, one must turn off rapidly while the other experiences a controlled turn-on. In the present discussion, this means that transistor 102 must turn-off rapidly as transistor 104 is controllably turned-on through opposing action of transistors 128 and 166.

Rapid turn-off of pull-up transistor 102 is accomplished by the use of transistor 110. As the input signal 124 goes low, transistors 106 and 140 are turned off and transistor 110 is turned on. This provides a rapid, uncontrolled turn-off of transistor 102. At the same time, and in a similar manner as that previously described with respect to controlled turn-on of transistor 102, transistor 104 experiences a controlled turn-on. A low at OCD input 124 and a high at enable signal 126 produces a low at driver input 136. This causes control to begin by activator 182 activating AC reference voltage circuit 170 and providing a reference voltage to transistor 166. Turn-on transistor 128 attempts to turn pull-down transistor 104 on, while transistor 166 acts in opposition thereto. In this way, transistor 104 experienced a controlled turn-on.

It should be noted that the presently preferred embodiment also allows the OCD 96 shown in FIG. 2 to be placed in a high-impedance state by placing a low signal on enable 126. This causes both capacitors 152 and 180 to charge, so that the circuit is prepared to handle the next input signal 124, regardless of whether it is a high or a low. FIG. 3 shows a truth table for OCD input signal 124, enable signal 126, and OCD output at node 188.

The present invention, as exemplified by the embodiment described herein, advances the state of the art by providing an off-chip driver that dissipates zero DC power, eliminates output feedback noise, and rapidly turns off the pulling devices commonly used in such circuits. The present invention avoids dissipation of DC power by utilizing an AC voltage reference circuit to provide for controlled turn-on of output devices. Output feedback noise is eliminated by avoiding the use of output feedback to stop transition control. Rapid turn-off of each pulling device is provided by a single transistor. In addition, such rapid turn-off in conjunction with controlled turn-on avoids dissipation of unnecessary power through the pulling devices being on simultaneously.

While a presently preferred embodiment of the invention has been described and depicted herein, alternative embodiments may be effected by those skilled in the art to accomplish the same objectives. Accordingly, it is intended by the appended claims to cover all such alternative embodiments as fall within the true spirit and scope of the invention.

What is claimed is:

1. A transition-controlled off-chip driver utilizing substantially no DC power, comprising:
   a driver circuit, comprising an output pull-up device, and an output pull-down device;
   means for controlling transition of said output pull-up device in response to a driver input signal, comprising a first AC voltage reference circuit drawing substantially no DC current for supplying a reference voltage to said output pull-up device during said transition thereof, wherein said transition control means of said output pull-up device compensates for variations in process and operating conditions;
   means for uncontrolled transition of said output pull-up device in response to said driver input signal;
   means for controlling transition of said output pull-down device in response to said driver input signal, comprising a second AC voltage reference circuit drawing substantially no DC current for supplying a reference voltage to said output pull-down device during said transition thereof, wherein said transition control means of said output pull-down device compensates for variations in process and operating conditions; and
   means for uncontrolled transition of said output pull-down device in response to said driver input signal.

2. The driver of claim 1, wherein said output pull-up device transition control means comprises a pull-up predrive circuit for turning on said output pull-up device, wherein said first AC voltage reference circuit supplies said reference voltage to said pull-up predrive circuit during said transition thereof.

3. The driver of claim 1, wherein said uncontrolled transition means for said output pull-up device comprises means for turning off said output pull-up device in response to said driver input signal.

4. The driver of claim 1, wherein said output pull-down device transition control means comprises a pull-down predrive circuit for turning on said output pull-down device, wherein said second AC voltage reference circuit supplies said reference voltage to said pull-down predrive circuit during said transition thereof.

5. The driver of claim 1, wherein said uncontrolled transition means for said output pull-down device comprises means for turning off said output pull-down device in response to said driver input signal.

6. The driver of claim 2, wherein said pull-up predrive circuit includes a p-type device connected between said output pull-up device and a power supply.

7. A transition-controlled off-chip driver utilizing substantially no DC power, comprising:
   a driver circuit, comprising an output pull-up device, and an output pull-down device;
   means for controlling transition of said output pull-up device in response to a driver input signal, comprising a first AC voltage reference circuit drawing substantially no DC current for supplying a reference voltage to said output pull-up device during said transition thereof, a pull-up predriver circuit for turning on said output pull-up device and means for activating said first AC voltage reference circuit wherein said first AC voltage reference circuit supplies said reference voltage to said pull-up predrive circuit during said transition thereof;

means for uncontrolled transition of said output pull-up device in response to said driver input signal;

means for controlling transition of said output pull-down device in response to said driver input signal, comprising a second AC voltage reference circuit drawing substantially no DC current for supplying a reference voltage to said output pull-down device during said transition thereof; and means for uncontrolled transition of said output pull-down device in response to said driver input signal.

8. A transition-controlled off-chip driver utilizing substantially no DC power, comprising:

a driver circuit, comprises an output pull-up device, and an output pull-down device;

means for controlling transition of said output pull-up device in response to a driver input signal, comprising a first AC voltage reference circuit drawing substantially no DC current for supplying a reference voltage to said output pull-up device during said transition thereof, a pull-up predrive circuit for turning on said output pull-up device, wherein said first AC voltage reference circuit comprises a voltage divider network, a capacitor coupled to said voltage divider network that stores charge in response to said driver input signal and provides said charge to said voltage divider network and means for charging said capacitor in response to said driver input signal, and wherein said first AC voltage reference circuit supplies said reference voltage to said pull-up predrive circuit during said transition thereof;

means for uncontrolled transition of said output pull-down device in response to said driver input signal, comprising a second AC voltage reference circuit drawing substantially no DC current for supplying a reference voltage to said output pull-down device during said transition thereof; and means for uncontrolled transition of said output pull-down device in response to said driver input signal.

9. The driver of claim 7, wherein said activation means comprises an inverter network.

10. The driver of claim 4, wherein said pull-down predrive circuit includes an n-type device connected between said output pull-down device and ground.

11. A transition-controlled off-chip driver utilizing substantially no DC power, comprising:

a driver circuit, comprising an output pull-up device, and an output pull-down device;

means for controlling transition of said output pull-up device in response to a driver input signal, comprising a first AC voltage reference circuit drawing substantially no DC current for supplying a reference voltage to said output pull-up device during said transition thereof;

means for uncontrolled transition of said output pull-up device in response to said driver input signal;

means for controlling transition of said output pull-down device in response to said driver input signal, comprising a second AC voltage reference circuit drawing substantially no DC current for supplying a reference voltage to said output pull-down device during said transition thereof, a pull-down predrive circuit for turning on said output pull-down device and means for activating said second AC voltage reference circuit wherein said second AC voltage reference circuit, supplies said reference voltage to said pull-down predrive circuit during said transition thereof; and means for uncontrolled transition of said output pull-down device in response to said driver input signal.

12. A transition-controlled off-chip driver utilizing substantially no DC power, comprising:

a driver circuit, comprising an output pull-up device and an output pull-down device;

means for controlling transition of said output pull-up device in response to a driver input signal, comprising a first AC voltage reference circuit drawing substantially no DC current for supplying a reference voltage to said output pull-up device during said transition thereof;

means for uncontrolled transition of said output pull-up device in response to said driver input signal;

means for controlling transition of said output pull-down device in response to said driver input signal, comprising a second AC voltage reference circuit drawing substantially no DC current for supplying a reference voltage to said output pull-down device during said transition thereof, a pull-down predrive circuit for turning on said output pull-down device, wherein said second AC voltage reference circuit comprises a voltage driver network, a capacitor coupled to said voltage divider network that stores charge in response to said driver input signal and provides said charge to said voltage divider network and means for charging said capacitor in response to said driver input signal, and wherein said second AC voltage reference circuit supplies said reference voltage to said pull-down predrive circuit during said transition thereof; and means for uncontrolled transition of said output pull-down device in response to said driver input signal.

13. The driver of claim 11, wherein said activation means comprises an inverter network.

14. A method of operating a transition-controlled off-chip driver circuit including an output pull-up device and an output pull-down device, such that turn-on of said output pull-up device in response to a driver input signal is controlled, turn-on of said output pull-down device in response to said driver input signal is controlled, and substantially no DC power is dissipated, comprising:

uncontrollably turning off said output pull-up device in response to said driver input signal;

uncontrollably turning off said output pull-down device in response to said driver input signal;

supplying an AC voltage reference in response to said driver input signal for said pull-up device turn-on control;

supplying an AC voltage reference in response to said driver input signal for said pull-down device turn-on control; and compensating for variations in process and operating conditions for said transition controlled off-chip driver circuit.

15. The method of claim 14, wherein said step of uncontrollably turning off said output pull-up device in response to said driver input signal is accomplished by including a p-type device connected between a power supply and said output pull-up device.

16. The method of claim 14, wherein said step of uncontrollably turning off said output pull-down device in response to said driver input signal is accomplished by including an n-type device connected between said output pull-down device and ground.

* * * * *

UNITED STATES PATENT AND TRADEMARK OFFICE
CERTIFICATE OF CORRECTION

PATENT NO. : 5,430,387
DATED : July 4, 1995
INVENTOR(S) : Bechade et al.

It is certified that error appears in the above-indentified patent and that said Letters Patent is hereby corrected as shown below:

Col. 7, line 22, delete "comprises" and substitute therefor --comprising--

Col. 7, between line 40 and line 41, insert the following paragraph

--means for uncontrolled transition of said output pull-up device in response to said driver input signal;--

Col. 7, line 41, delete "uncontrolled" and replace therefor --controlling--

Col. 8, line 32, delete "driver" and substitute therefor --divider--

Signed and Sealed this

Seventeenth Day of October, 1995

Attest:

BRUCE LEHMAN

Attesting Officer   Commissioner of Patents and Trademarks